(12) United States Patent
Van Gastel et al.

(10) Patent No.: US 8,482,303 B2
(45) Date of Patent: Jul. 9, 2013

(54) SENSOR ELECTRONICS IN A VEHICLE DOOR HANDLE

(75) Inventors: Peter Van Gastel, Solingen (DE); Iko Lindic, Essen (DE)

(73) Assignee: Huf Hulsbeck & Furst GmbH & Co. KG, Velbert (DE)

( * ) Notice: Subject to any disclaimer, the term of this patent is extended or adjusted under 35 U.S.C. 154(b) by 548 days.

(21) Appl. No.: 12/764,875

(22) Filed: Apr. 21, 2010

(65) Prior Publication Data

US 2010/0271049 A1    Oct. 28, 2010

(30) Foreign Application Priority Data

Apr. 22, 2009   (DE) .......................... 10 2009 002 566

(51) Int. Cl.
   *G01R 27/26* (2006.01)
(52) U.S. Cl.
   CPC .................................. *G01R 27/2605* (2013.01)
   USPC ......................................................... 324/679
(58) Field of Classification Search
   None
   See application file for complete search history.

(56) References Cited

U.S. PATENT DOCUMENTS

| | | | | |
|---|---|---|---|---|
| 5,373,245 A * | 12/1994 | Vranish | ......................... | 324/662 |
| 5,730,165 A | 3/1998 | Philipp | | |
| 5,801,340 A * | 9/1998 | Peter | ......................... | 178/20.04 |
| 6,825,752 B2 * | 11/2004 | Nahata et al. | ................ | 340/5.64 |
| 7,015,704 B1 * | 3/2006 | Lang | ............... | 324/661 |
| 7,071,812 B2 * | 7/2006 | Mafune et al. | ................. | 340/5.7 |
| 7,126,453 B2 * | 10/2006 | Sandau et al. | ............... | 340/5.61 |
| 7,154,393 B2 * | 12/2006 | Okushima et al. | ............ | 340/562 |
| 7,489,142 B2 * | 2/2009 | Somers | ......................... | 324/661 |
| 2003/0009855 A1 * | 1/2003 | Budzynski | ....................... | 16/443 |
| 2006/0056663 A1 * | 3/2006 | Call | .............................. | 382/115 |

FOREIGN PATENT DOCUMENTS

| | | |
|---|---|---|
| DE | 20307931 | 9/2004 |
| DE | 10 2005 017 451 | 10/2006 |
| DE | 19681725 | 4/2007 |
| DE | 102007012111 | 10/2007 |
| DE | 102006044778 | 3/2008 |
| EP | 0518836 | 12/1992 |
| EP | 1 164 240 | 12/2001 |
| EP | 1235190 | 8/2002 |
| EP | 1339025 | 8/2003 |

(Continued)

*Primary Examiner* — Paresh Patel
(74) *Attorney, Agent, or Firm* — Blakely Sokoloff Taylor & Zafman

(57) ABSTRACT

A solution for sensor electronics provided in a door handle of a vehicle with a sensor control circuit (6) that is provided on a circuit board (1) and with a sensor electrode (11) of a capacitive sensor for detection of the approach of an object to the door handle connected to the sensor control circuit through which the sensitivity is improved, interference is decreased, and a compact structure is achieved. This task is solved by sensor electronics with a ground-metallization plane having a ground potential and a shielding electrode provided between the sensor electrode (11) and the ground-metallization plane, whereby the circuit board (1) has at least four metallization planes (7, 8, 9, 10) insulated from each other by insulating layers (13, 14, 15), whereby a first metallization plane (7) is provided on an upper side (5) of circuit board (1) including wiring connections between the components of the sensor control circuit (6), a second metallization plane (8) that is the ground-metallization plane, a third metallization plane (9) that includes the shielding electrode, and a fourth metallization plane (10) that includes the sensor electrode (11) so that the wiring connections of the components of the sensor control circuit (6) are provided on one side of the ground-metallization plane and the shielding electrode and the sensor electrode (11) on the other side of the ground-metallization plane.

9 Claims, 1 Drawing Sheet

FOREIGN PATENT DOCUMENTS

| FR | 2 825 743 | 12/2002 |
| WO | WO 89/08352 | 9/1989 |
| WO | WO 02/33203 | 4/2002 |
| WO | WO 03/071067 | 8/2003 |

* cited by examiner

SENSOR ELECTRONICS IN A VEHICLE DOOR HANDLE

FIELD OF THE INVENTION

The invention relates to a sensor electronics provided in a door handle of a vehicle, the sensor electronics comprising a sensor control circuit that is provided on a circuit board, and a sensor electrode of a capacitive sensor coupled to the sensor control circuit for detection of the approach of an object to the door handle, the circuit board being provided inside the door handle.

BACKGROUND OF THE INVENTION

Sensor electronics of the type previously mentioned are used, for example, in order to detect the approach of the hand of an operator (driver) to the outer door handle of the vehicle. When the approach of the hand of the operator is detected, control electronics provided in the vehicle initiate an inquiry by radio of an ID encoder (electronic key) carried by the operator, i.e., a transponder or radio transmission receiver that the operator carries (for example, in a clothing pocket or in a briefcase). This inquiry by radio is made, for example, with aid of transmission of a radio signal in a frequency range of, for example, 125 kHz, i.e., an LF frequency range, whereby a coil is used for emitting that, for example, can be provided inside the door handle. If the ID encoder is in the reception range of the transmission coil, it receives the radio signal, acknowledges a challenge to identify, and sends a response signal in a higher frequency range (for example, in the Megahertz frequency range), which includes a code identifying the ID encoder. The control device in the vehicle receives this response, checks the code, and then opens the door lock with the aid of the door handle activated by the operator. The sensor detecting the approach of the operator is utilized in particular so that an inquiry signal does not constantly have to be emitted by the transmitter coil. The inquiry signal is transmitted only when the approach of a body part of the operator is detected.

A capacitive approach sensor is usually used for detection of the approach of a body part of the operator to the door handle. A capacitive approach sensor of this type is, for example, described in publication EP 1 339 025 A1 or in publication EP 1 235 190. A basic principle of the sensor is, for example, described in publication U.S. Pat. No. 5,730,165 A.

In order to improve the sensitivity of a capacitive sensor having a sensor electrode or to extend the range of the sensor, t was proposed that a shielding metallic surface be provided between the sensor electrode and the solid metallic ground surface of the vehicle (there may also be a ground surface in a circuit inside the door handle), wherein the potential of this shielding metallic surface is tracked by means of a voltage tracking circuit (without the two electrodes being connected with each other). Active shielding of this type is, for example, described in publication EP 0 518 836 A1.

SUMMARY OF THE INVENTION

Based on this state of the art, the task of the invention is to create sensor electronics of the kind described above in a door handle of a vehicle, in which the sensitivity is improved, interference decreased, and a compact structure achieved.

According to the invention, this task is solved by sensor electronics provided in a door handle of a vehicle with the characteristics of Patent claim 1. The sensor electronics have a sensor control circuit located on a circuit board that has a ground-metallization plane having a ground potential. The sensor electronics further include a sensor electrode of a capacitive sensor connected with the sensor control circuit for detection of the approach of an object to the door handle and shield electrode provided between the sensor electrode and the ground metallization plane of the circuit board, and a shield electrode control circuit coupled to the shield electrode for tracking the potential of the shield electrode with the potential of the sensor electrode. By sensor control circuit is meant any circuit configuration that on one hand includes circuits for evaluation of and forwarding sensor output signals and on the other hand includes circuits for controlling sensors and/or other elements of the door electronics. The circuit board is provided on the inside of the door handle and the components of the sensor control circuit are mounted on an upper side of the circuit board. The circuit board has at least four metallization planes insulated from each other by insulating layers, a first metallization plane provided on an upper surface of the circuit board including wiring connections between the components of the sensor control circuit, a second metallization plane comprising the ground-metallization plane, a third metallization plane including the shield electrode, and a fourth metallization plane including, the sensor electrode so that the wiring connections of the components of the sensor control circuit are provided on one side of the ground-metallization plane and the shield electrode and the sensor electrode on the other side of the ground-metallization plane. Such an arrangement allows on the one hand creation of a shielded capacitive sensor electrode with a single circuit board structure and on the other hand connection of shielding between the sensor electrode and the sensor control circuit to reduce effects of currents flowing or voltages applied in the sensor control circuit on the sensor electrode. With aid of the invention the electromagnetically compatible function of all electrical means of the sensor electronics are assured, so that adherence to laws and guidelines regarding electromagnetic compatibility (EMC) is ensured.

Advantageous and practical embodiments and further development of the invention result from the corresponding dependent claims.

In a preferred embodiment, the sensor control circuit includes a transmitter coil of a circuit for communication with a transportable ID encoder, i.e., for example, the aforementioned transmitter coil that transmits a wake-up signal in the LF frequency range (for example, 125 kHz) to the ID encoder, In this embodiment of the device according to the invention, in particular the insertion of the ground-metallization plane, increases the EMC security of the coil.

As regards the compact structure of the sensor electronics, further development of the invention foresees that the control circuit of the shield electrode is a part of the sensor control circuit. For further increase of compactness it is of advantage if the wiring connections for the voltage supply for the sensor control circuit are provided in the first metallization plane.

In a further embodiment of the sensor electronics according to the invention at least one further metallization plane is provided between the first metallization plane and the ground-metallization plane, which at least one further metallization plane has voltage supply leads and/or wiring connections between the components of the sensor control circuit.

It is especially preferred if the circuit board has a total thickness of between 1 mm and 3 mm, advantageously approx. 1.5 mm. An insulating layer with a thickness of 0.3 to 2 mm, advantageously approx. 0.5 mm, can be provided between the second metallization plane and the third metallization plane.

In a preferred embodiment of the invention the shield electrode extends beyond the sensor electrode on all sides by at least 0.3 mm, advantageously by about 0.3 to 0.6 mm.

In a further embodiment of the invention it is foreseen that the metallization planes are formed of conducting layers, advantageously copper layers, of 35 μm to 70 μm.

Finally, the invention envisions further development whereby the circuit board is set adjacent to an outer wall of the door handle in such a way that the sensor electrode abuts to the outer wall.

It is clear that the above-named characteristics and those to be clarified below can be applied not only in the combination indicated but also in other combinations. The scope of the invention is defined only by means of the claims.

Further details, characteristics, and advantages of the object of the invention can be seen from the following detailed description in combination with the drawing, in which a preferred exemplary embodiment of the invention is depicted.

DETAILED DESCRIPTION OF THE INVENTION

Figure 1:
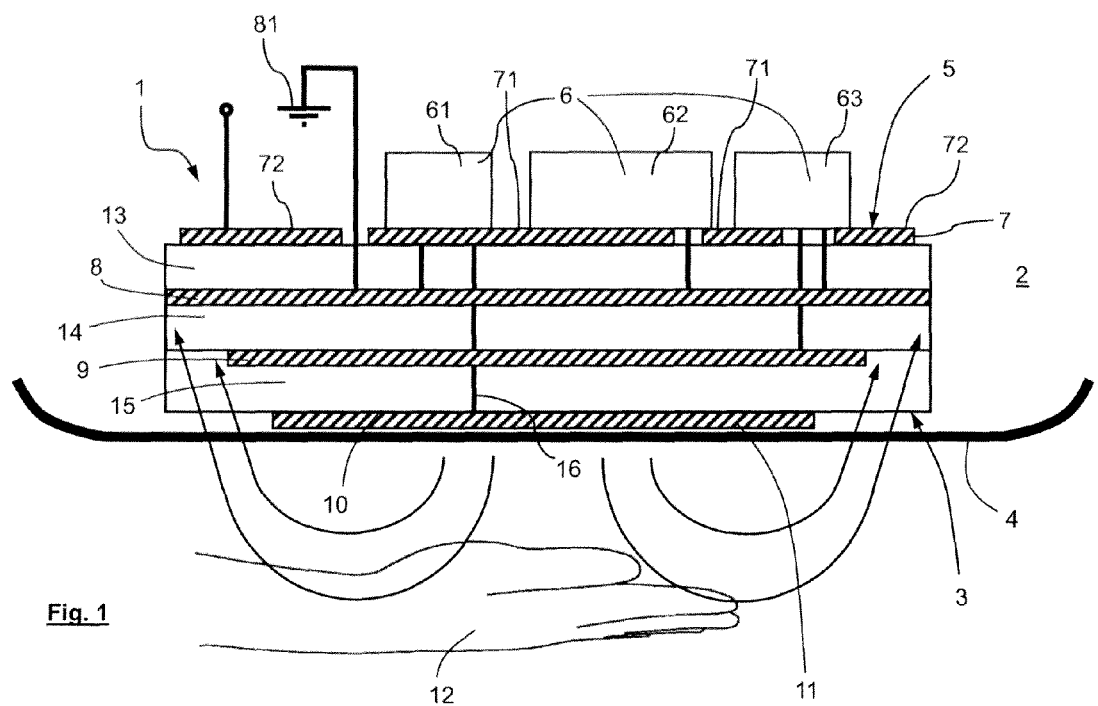
FIG. 1: a schematic depiction of sensor electronics according to the invention provided in a vehicle door handle.

FIG. 1 shows a schematic cross section of sensor electronics according to the invention that is integrated in a circuit board 1. Circuit board 1 is located in an internal space 2 of a door handle of a vehicle and lies with a lower side 3 against an outer wall 4 of the door handle. Components 61, 62, 63 of a sensor control circuit 6 are attached to an upper side 5 of circuit board 1.

Circuit board 1 has a first metallization plane 7 on its upper side 5. First metallization plane 7 includes wiring connections 71, 72 between the components 61, 62, 63 of sensor control circuit 6, including voltage supply leads 72. Circuit board 1 further has a second metallization plane 8. which is a ground surface or a ground-metallization plane, carries a ground potential, and supplies sensor control circuit 6 with ground 81.

Circuit board 1 also includes a third metallization plane 9 and a fourth metallization plane 10. Fourth metallization plane 10 has at least one sensor electrode 11 of a capacitive sensor that is spaced from the ground-metallization plane (second metallization plane 8). Sensor electrode 11 serves to detect the approach of an object to the door handle. In the depiction the object is a hand 12 of an operator that is located in the electrical field produced by sensor electrode 11. Sensor electrode 11 is connected by a lead 16 to sensor control circuit 6.

Sensor control circuit 6, which is also designated as activation electronics, contains evaluation electronics or a test circuit for determination of the capacity of sensor electrode 11 against the ground. Between sensor electrode 11 and the ground-metallization plane (second metallization plane 8) a given capacity can be measured that on the one hand is dependent on the form and arrangement of sensor electrode 11 against the ground-metallization plane and on the other hand both on the material between sensor electrode 11 and the ground-metallization plane and on the objects located in the vicinity of sensor electrode 11. If a voltage is applied between sensor electrode 11 and the ground-metallization plane 8, an electric field forms between sensor electrode 11 and the ground-metallization plane 8, which normally assumes its highest field strength where sensor electrode 11 has the least distance from the ground-metallization plane 8. The strongest electrical field would form directly between sensor electrode 11 and the ground-metallization plane 8 and only a small part of the electrical field would extend into the surroundings. This would mean that changes of objects located in the vicinity would have only a relatively slight influence on the electrical field and thus on the capacity measured between sensor electrode 11 and the ground-metallization plane 8. In order to increase the sensitivity of the sensor electronics it was proposed that a shield electrode be provided in the third metallization plane 9 between sensor electrode 11 and the ground-metallization plane 8, i.e., between fourth metallization plane 10 and second metallization plane 8. A shield electrode control circuit 63 ensures that the potential of the shield electrode 9 is tracked with the potential of sensor electrode 11, the sensor electrode 11 being not directly connected with the shield electrode. The shield electrode 9 with the corresponding shield electrode control circuit 63 then ensures that no strong electric field forms between sensor electrode 11 and the ground-metallization plane 8 but the field extends instead primarily outside circuit board 1 (i.e., in front of the door handle). This leads in turn to stronger dependence of the field strength or the capacity of the total device on objects located in the field, which means higher sensitivity of the capacitive sensor that is then better suited as an approach sensor.

There are various methods to measure the capacity of the capacitive sensor. In most methods a variable voltage is applied between sensor electrode 11 and the ground-metallization plane 8, which means that the potential of the shield electrode must continually be tracked with the potential of sensor electrode 11. The methods for measuring capacity and tracking the potential are known from the state of the art, for example, from publications EP 0 518 836 A1, DE 196 81 725 B4 or DE 10 2006 044 778 A1. The measuring principles and the technology of tracking the potential of shield electrode 11 should for that reason not be described in more detail here.

Altogether the structure of circuit board 1 has four metallization planes 7, 8, 9, and 10 that are insulated from each other by insulating layers 13, 14, and 15. The connecting leads of the components of sensor control circuit 6 are provided on one side of the ground-metallization plane 8 and shield electrode 6 and sensor electrode 11 on the other side of the ground-metallization plane 8.

The thicknesses of metallization planes 7, 8, 9, 10 and insulating layers 13, 14, 15, and the spacings of metallization planes 7, 8, 9, 10 from each other as shown in FIG. 1 depend on one hand on production technology and on the other hand on the desired effective area of the sensor electronics. For example, the spacing between metallization planes 7, 8, 9, 10, respectively the thicknesses of insulating layers 13, 14, 15 are greater than the thickness of metallization layers 7, 8, 9, 10. Insulating layer 14 provided between the ground-metallization plane (second metallization plane 8) and the shield electrode (third metallization plane 9) may, for example, have a thickness of 0.3 mm to 2 mm, whereby a thickness of about 0.5 mm is preferred. The other insulating layers 13 and 15 may moreover have a thickness comparable to the thickness of insulating layer 14. It is also thinkable in this connection that metallization planes 7, 8, 9, 10 are formed from conducting layers of 35 μm to 70 μm, whereby copper layers are preferred as conducting layers. As further depicted in FIG. 1, shield electrode 11 extends beyond sensor electrode 8 on all sides by at least 0.3 mm. An area of about 0.3 to 0.6 mm is also thinkable in order that shield electrode 11 extends on all sides beyond sensor electrode 8.

In a preferred embodiment sensor control circuit 6 includes a transmitter coil 62 of a circuit for communication with a transportable ID encoder.

In a further design of the depicted embodiment it is thinkable that the leads 72 for voltage supply to sensor control circuit 6 are provided in first metallization plane 7.

Between first metallization plane 7 and the ground-metallization plane (i.e., second metallization plane 8) at least one further optional metallization plane can be provided, which has voltage supply leads and/or wiring connections between the components of sensor control circuit 6.

Altogether the invention provides sensor electronics that are integrated in a circuit board 1 with a thickness between 1 mm and 3 mm, whereby a total thickness of about 1.5 mm is preferred. Circuit board 1 can be located at outer wall 4 of the door handle in such a way that sensor electrode 8 abuts to the outer wall 4.

We claim:

1. A sensor electronics in a door handle of a vehicle, comprising:
    a capacitive sensor for detecting the approach of an object to the door handle, the capacitive sensor comprising:
    a sensor electrode and
    a shield electrode disposed between the sensor electrode and a ground metallization plane having a ground potential, the shield electrode connected to a shield electrode control circuit that tracks the potential of the shield electrode with the potential of the sensor electrode;
    a sensor control circuit coupled to the sensor electrode for evaluation of and forwarding sensor output signals, the sensor control circuit having components; and
    a circuit board being arranged in an internal space of the door handle, the components of the sensor control circuit being mounted on an upper side of the circuit board, the circuit board having at least four metallization planes insulated from each other by insulating layers, the metallization planes comprising:
    a first metallization plane on the upper side including wiring connections between the components of the sensor control circuit,
    a second metallization plane comprising the ground-metallization plane,
    a third metallization plane including the shield electrode, and
    a fourth metallization plane including the sensor electrode;
    wherein the wiring connections between the components of the sensor control circuit are arranged on one side of the ground-metallization plane and the shield electrode and the sensor electrode are arranged on the other side of the ground-metallization plane.

2. The sensor electronics according to claim 1, wherein the sensor control circuit includes a transmitter coil of a circuit for communication with a transportable ID encoder.

3. The sensor electronics according to claim 1 or 2, wherein the shield electrode control circuit is a part of the sensor control circuit.

4. The sensor electronics according to claim 1, wherein the wiring connections in the first metallization plane comprise voltage supply leads for the sensor control circuit.

5. The sensor electronics according to claim 1, wherein the circuit board has a total thickness of between 1 mm and 3 mm, advantageously approx. 1.5 mm.

6. The sensor electronics according to claim 5, wherein an insulating layer is provided between the second metallization layer and the third metallization layer with a thickness of 0.3 to 2 mm, advantageously about 0.5 mm.

7. The sensor electronics according to claim 1, wherein the shield electrode extends beyond the sensor electrode on all sides by at least 0.3 mm, advantageously by about 0.3 to 0.6 mm.

8. The sensor electronics according to claim 1, wherein the metallization planes are formed of conducting layers, advantageously of copper layers, of 35 mm to 70 mm.

9. The sensor electronics according to claim 1, wherein the circuit board is provided adjacent to an outer wall of the door handle in such a way that the sensor electrode abuts to the outer wall.

* * * * *